United States Patent
Hebras (10) Patent No.: US 7,485,551 B2
(45) Date of Patent: Feb. 3, 2009

(54) SEMICONDUCTOR-ON-INSULATOR TYPE HETEROSTRUCTURE AND METHOD OF FABRICATION

(75) Inventor: Xavier Hebras, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 256 days.

(21) Appl. No.: 11/327,015

(22) Filed: Jan. 5, 2006

(65) Prior Publication Data

US 2007/0054466 A1 Mar. 8, 2007

(30) Foreign Application Priority Data

Sep. 8, 2005 (FR) .................................. 05 09168

(51) Int. Cl.
H01L 21/265 (2006.01)

(52) U.S. Cl. ................... 438/474; 438/455; 438/458; 438/471; 438/473; 438/475; 438/476; 438/480; 438/514; 438/515; 438/522; 438/526; 438/527; 438/528; 438/530; 438/558; 438/795; 438/799; 438/974

(58) Field of Classification Search ................ 438/459, 438/455, 458, 471, 473–476, 526, 974, 558, 438/480, 514, 515, 522, 527, 528, 530, 795, 438/799

See application file for complete search history.

(56) References Cited

U.S. PATENT DOCUMENTS

| | | | |
|---|---|---|---|
| 5,953,622 A | 9/1999 | Lee et al. ................... 438/458 |
| 6,013,563 A * | 1/2000 | Henley et al. ............... 438/458 |
| 6,696,352 B1 | 2/2004 | Carr et al. .................... 438/458 |
| 2002/0187619 A1* | 12/2002 | Kleinhenz et al. ........... 438/471 |
| 2002/0190269 A1 | 12/2002 | Atwater, Jr. et al. ......... 257/184 |
| 2004/0121558 A1* | 6/2004 | Letertre et al. .............. 438/459 |
| 2004/0137698 A1* | 7/2004 | Taraschi et al. ............. 438/458 |
| 2004/0171196 A1 | 9/2004 | Walitzki ...................... 438/137 |
| 2005/0048738 A1* | 3/2005 | Shaheen et al. ............. 438/458 |
| 2006/0141746 A1* | 6/2006 | Delattre et al. .............. 438/455 |
| 2006/0154445 A1* | 7/2006 | Iwabuchi ..................... 438/458 |
| 2006/0160327 A1* | 7/2006 | Barna ......................... 438/455 |

FOREIGN PATENT DOCUMENTS

EP          1 174 926 A1    1/2002
WO    WO 2005/055290 A2 *  6/2005

\* cited by examiner

*Primary Examiner*—Matthew Smith
*Assistant Examiner*—Maliheh Malek
(74) *Attorney, Agent, or Firm*—Winston & Strawn LLP

(57) ABSTRACT

The present invention relates to a method of fabricating a semiconductor-on-insulator-type heterostructure that includes at least one insulating layer interposed between a receiver substrate of semiconductor material and an active layer derived from a donor substrate of semiconductor material. The method includes the steps of bonding and active layer transfer. Prior to bonding, an atomic species which is identical or isoelectric with the insulating layer material is implanted in the insulating layer. The implantation forms a trapping layer, which can retain gaseous species present in the various interfaces of the heterostructure, thereby limiting formation of defects on the surface of the active layer.

18 Claims, 5 Drawing Sheets

SEMICONDUCTOR-ON-INSULATOR TYPE HETEROSTRUCTURE AND METHOD OF FABRICATION

FIELD OF INVENTION

The present invention relates to the field of semiconductors and, particularly, to fabrication of semiconductor-on-insulator-type heterostructures.

BACKGROUND OF THE INVENTION

A "semiconductor-on-insulator" ("SeOI") type substrate is known. A SeOI type substrate generally comprises at least one insulating layer interposed between two layers of semiconductor material. A SeOI substrate or heterostructure has applications in many fields, especially in the fields of optics, electronics, and optoelectronics.

SeOI substrates are generally fabricated using the following steps:

forming or depositing an insulating layer on a first substrate termed the "donor" substrate, so that a "connection" interface exists between them;

implanting atomic species within the donor substrate using a method known commercially as SMART-CUT® to form a zone of weakness therein;

bonding a second substrate termed the "receiver" substrate onto the free surface of the insulator by molecular bonding; and detaching the back portion of the donor substrate along the zone of weakness.

A heterostructure is thereby obtained comprising, in succession, a support, an insulating layer, and an upper active layer derived from the donor substrate.

In the microelectronics field, the surface quality of the active layer of semiconductor material is of great importance. The roughness and the absence of defects on the surface of the active layer are parameters that must be optimized, and determine the quality of future components which are produced from the heterostructure. However, various types of surface defects may appear following transfer of the active layer onto the receiving substrate, including, for example: non transferred zones (abbreviated "NTZ"); blisters; voids; and crystal orientated voids (abbreviated "COV").

The defects are caused by, for example, poor transfer; the presence of subjacent defects in various layers of the heterostructure; poor bonding quality at the bonding interface; or, merely by the imprecise methods employed in fabricating the heterostructure, such as the implantation of atomic species or heat treatment(s). The defects present at the bonding or connection interface become locations where gas can become trapped during the heterostructure fabrication, and which then expand and form COV-type blisters or voids.

For example, in the case of a heterostructure comprising, in succession, a silicon substrate support covered with a layer of thermal oxide, then with a layer of tetraethylorthosilicate (TEOS) oxide obtained by low pressure chemical vapor deposition (LPCVD), and finally with a layer of germanium, gaseous elements may be introduced by several sources. The term "LPCVD TEOS" designates a silicon oxide ($SiO_2$) obtained by low pressure chemical vapor deposition from a TEOS type precursor. Gaseous elements may originate from:

hydrogen or helium supplied during an atomic species implantation step, which is intended to form a zone of weakness, the quantity of the gaseous elements depending on the type of implanter used and the implantation conditions (dose and energy);

desorption of water molecules ($H_2O$) present at the bonding interface between the thermal oxide and the TEOS oxide; or the TEOS oxide, if densification thereof has not been sufficient, due to diffusion of carbon-containing compounds.

Further, it is noted that the thinner the active layer, the greater the number of defects. When the active layer is relatively thick, blister or void type defects are generally retained in the thickness of the active layer, so fewer defects appear on the surface.

Figure 3:
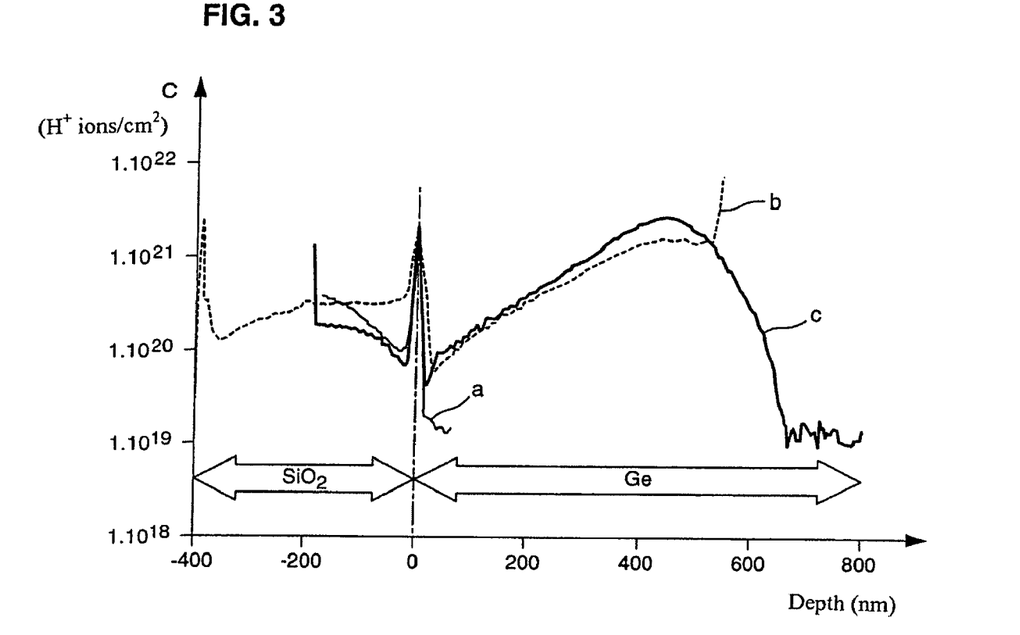
FIG. 3 is a graph plotting the concentration C in $H^+$ ions/$cm^2$ as a function of depth, in a composite substrate resulting from bonding between a support substrate (Si) which has undergone thermal oxidation and a Ge donor substrate on which a layer of $SiO_2$ has been deposited, the results having been obtained by secondary ion mass spectroscopy (SIMS)

An illustrative example of the problems with such defects is shown in FIG. 3. This figure is a graph plotting the concentration C in $H^+$ ions/$cm^2$ (hydrogen ions/square centimeter) in a composite substrate as a function of the depth in nanometer (nm), which results were obtained by secondary ion mass spectroscopy (SIMS). The composite substrate is the result of bonding of a support substrate (Si) which has undergone thermal oxidation and a Ge donor substrate on which a layer of $SiO_2$ has been deposited. The bonding interface is thus made between two oxides, one belonging to the support substrate and the other belonging to the donor substrate. In FIG. 3, the bonding interface between the two layers of $SiO_2$ is located at −200 nm. The support substrate is not shown in FIG. 3; only its connection interface with the $SiO_2$ layer is shown and that interface is located at −400 nm.

Solid curve "a" shows the results obtained before a SMART-CUT® atomic species implantation to form the zone of weakness within the layer of germanium. The hydrogen ions are principally found at the bonding interface between the first layer of $SiO_2$ and the germanium layer.

Bold curve "c" shows the results obtained following implantation to provide a zone of weakness and prior to bonding with the second layer of $SiO_2$. It should be noted that the vertical line at −200 nm is an artifact. The values only begin close −200 nm as this corresponds to implantation carried out before bonding the second layer of $SiO_2$. In the particular case of germanium, detachment does not occur at the maximum implantation level but a little later (at about 550 nm), which explains the shape of curve "b."

Curve "b" in dotted lines shows the results obtained after bonding the two $SiO_2$ layers and after detachment and transfer of the active germanium layer. The hydrogen species distribution shows an accumulation at the $SiO_2$/Ge and $SiO_2$/support substrate connection interfaces. A very small peak at the $SiO_2$ layer appears at −200 nm: it corresponds to the bonding interface of the two layers of $SiO_2$.

A substantial increase in the quantity of gas in the insulating layer ($SiO_2$) can be seen after the step of detachment and transfer of the active germanium layer. This increase is the source of defects visible after transfer on the upper face of the transferred germanium layer.

United States Publication No. US 2002/0190269 describes a method of fabricating a heterostructure comprising a layer of germanium on silicon, the method being intended to reduce formation of bubbles at the bonding interface. The heterostructure is obtained by implanting hydrogen into a germanium donor substrate to form a zone of weakness therein, then bonding to a silicon receiver substrate, and finally heat-treating to detach the back portion of the germanium substrate. In a particular implementation, the author suggests disposing a layer termed an "anti-bubble" layer of amorphous silicon on the germanium substrate prior to bonding, to render the bonding interface hydrophilic and thereby reduce the formation of bubbles of hydrogen when the germanium substrate is bonded to the silicon substrate. In a further variation, it is suggested that the roughness of the transferred layer of germanium be improved by depositing thereon a buffer layer of germanium formed by epitaxial growth. These two suggestions are aimed at improving the quality of the bonding interface between the two substrates, but they necessitate adding a supplemental layer, which complicates the method.

Therefore, an improved method which achieves better bonding surface quality is desired.

SUMMARY OF THE INVENTION

The present invention relates to a substrate and process reducing or avoiding the formation of defects on the surface of the transferred active layer, including the defects caused by agglomeration of gaseous elements at various bonding and/or connection interfaces. This improvement is achieved without recourse to the deposition of intermediate layers (i.e., amorphous or buffer layers), which previously would be deposited or interposed between the insulating layer and the active layer according to the prior art methods, and which are not desirable because they tend to modify the electrical properties of the final structure. To achieve these improvements, the present invention relates to a SeOI-type substrate, which generally comprises at least one insulating layer interposed between two layers of semiconductor material. This structure is preferably obtained by a method which comprises:

providing donor and receiver substrates;

providing at least one insulating layer on at least one of the donor or receiver substrates;

implanting atomic species in the insulating layer(s) to form a trapping layer within the insulating layer, with the atomic species being identical to or isoelectric with one of the species constituting the insulating layer so that the trapping layer is capable of sufficiently retaining gas in the interface to reduce or limit formation of defects in or on the active layer;

bonding the donor substrate and the receiver substrate by molecular bonding of their respective top surfaces to interpose the insulating layer(s) between the donor and receiver substrates and form a connection interface between such surfaces; and removing or withdrawing a portion of the donor substrate to provide the heterostructure and expose the active layer, wherein the heterostructure comprises the receiver substrate, the insulating layer(s) and the active layer.

The insulator material of the insulating layer can be an oxide or a nitride. When the insulator is silicon dioxide ($SiO_2$), the implanted atomic species comprises silicon, germanium or oxygen atoms. When the insulator is silicon nitride ($Si_3N_4$), the implanted atomic species comprises silicon, germanium or nitrogen atoms. Also, the implantation energy and dose can be adjusted depending on the atomic species used.

According to a preferred embodiment of the present method, a zone of weakness can be formed in the donor substrate, for example by implantation of an atomic species, prior to bonding of the donor and receiver substrates. The zone of weakness can be used to define the active layer from the portion of the donor substrate to be removed or withdrawn.

The invention also relates to a semiconductor-on-insulator-type heterostructure comprising at least one insulating layer interposed between a receiver semiconductor substrate and an active semiconductor layer, wherein the insulating layer comprises a layer for trapping gas formed by voids and nanoparticles. Such heterostructure advantageously limits or eliminates the defects formed on the surface of the active layer.

BRIEF DESCRIPTION OF THE DRAWINGS

In the following detailed description, reference will be made to the drawings, in which.

DETAILED DESCRIPTION OF THE PREFERRED EMBODIMENTS

As noted above, the present invention relates to a method of fabricating a "semiconductor on insulator" type substrate known by the acronym "SeOI." These type substrates are known in the art and typically comprise at least one insulating layer interposed between a substrate termed the "receiver" substrate formed from semiconductor material and a layer termed the "active" layer, derived from a semiconductor material substrate termed the "donor" substrate. A particular example of an SeOI substrate is a silicon on insulator or SOI substrate. The present method preferably comprises the steps of forming or depositing at least one insulating layer on at least one of the donor and receiver substrates; bonding the donor substrate and the receiver substrate by molecular bonding such that the insulating layer(s) is interposed between them and such that a bonding interface exists between one of the two substrates and one of the insulating layers or between the two insulating layers; withdrawing a portion of the donor substrate termed the "remainder" to retain only the active layer and to obtain the heterostructure.

As used herein, the term "insulator" includes an electrically insulating material which may have high permittivity.

This method is remarkable in that prior to bonding, at least one kind of atomic species is implanted in at least one of the insulating layers, the atomic species being selected so as to be either identical or isoelectric with one of the species constituting the insulating layer in which they are implanted, so as to form therein a layer termed the "trapping layer" which can retain the gaseous species that may be present at the various interfaces of the heterostructure and reduce or limit the formation of defects on the surface of the active layer of the heterostructure compared to conventional heterostructures where such identical or isoelectric atomic species are not implanted.

Other advantageous non-limiting characteristics of the invention, taken alone or in combination, are as follows:

after forming the trapping layer, a step of annealing the insulating layer containing the trapping layer is carried out at a temperature of at least 350° C. for at least 30 minutes. The skilled artisan can determine the optimum annealing conditions for the specific structures that are produced;

the implantation parameters are selected so as to form the trapping layer either close to the bonding interface, preferably at a distance of 2 nanometers to 10 nanometers from the bonding interface, or close to the connection interface between the insulating layer(s) or between an insulating layer and one of the substrates;

the insulator may be an oxide, for example silicon dioxide ($SiO_2$), and the implanted species are thus selected from silicon, germanium, and oxygen atoms;

the insulator may be a nitride, for example silicon nitride ($Si_3N_4$) and the implanted species are thus selected from silicon, germanium, and nitrogen atoms;

the back portion is withdrawn by chemical-mechanical polishing;

prior to bonding, a zone of weakness is formed in the source substrate, the zone of weakness defining the active layer from the remainder of the substrate destined to be lifted; the zone of weakness is preferably formed by atomic species implantation;

The invention also relates to a "semiconductor on insulator" type heterostructure comprising at least one insulating layer interposed between a substrate termed the "receiver" substrate formed from semiconductor material and a layer termed the "active" layer formed from semiconductor material. In accordance with the invention, at least one of the insulating layers comprises a layer for trapping gaseous species constituted by a two-dimensional layer of voids (nanocavities) or nanoparticles.

Other characteristics of the invention become apparent from the following description made with reference to the accompanying drawings which, by way of non-limiting indication, show possible implementations. Also, a preferred embodiment of the invention is now described with reference to FIGS. 1A to 1E.

Figure 1A:
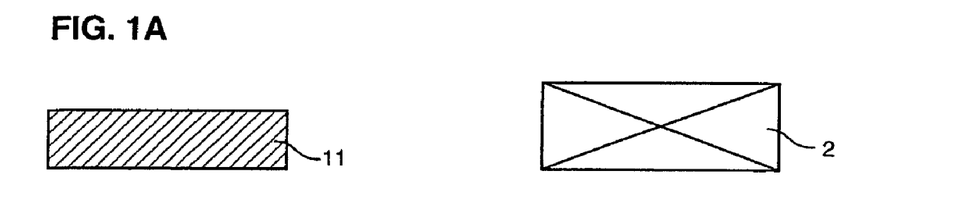
FIGS. 1A to 1E graphically illustrate various successive steps according to one embodiment of the present fabrication method.
Figure 1B:
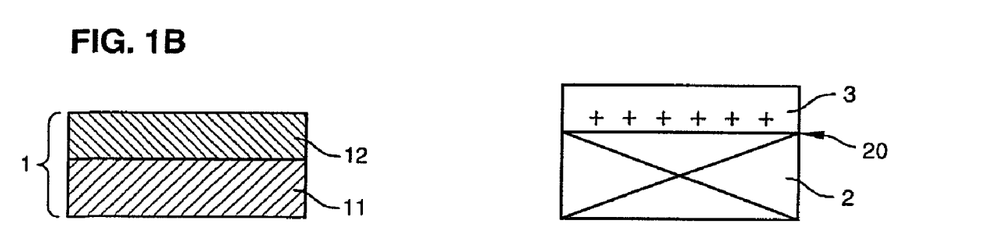

As can be seen in FIGS. 1A and 1B, a substrate 1 is used. It is termed the "donor" substrate as this substrate is used to produce the active layer composite substrate or heterostructure obtained at the end of the method. The donor substrate 1 may be a monolayer or a multilayer, for example having two layers, as shown in FIG. 1B. In this case, it is composed of a primary layer 11 covered with a secondary layer 12. The secondary layer is deposited on the primary layer by epitaxy, for example. A support substrate or receiver substrate 2 is used, on or in which an insulating layer 3 is deposited or formed, as shown in FIG. 1B. A connection interface with reference number 20 exists between the insulating layer 3 and the receiver substrate 2.

Figure 1C:
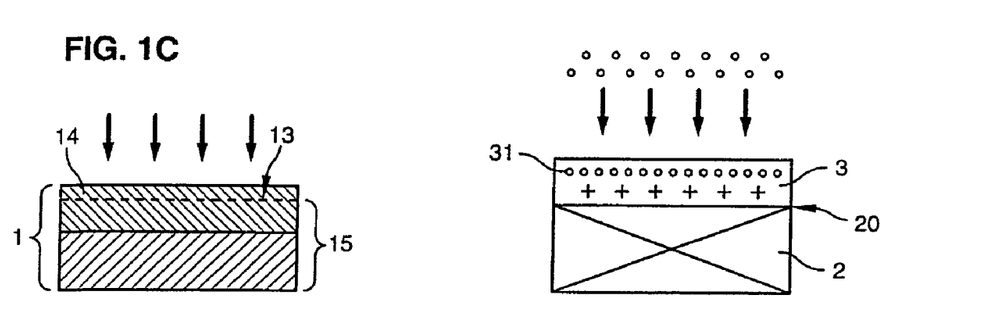

As can be seen in FIG. 1C, atomic species are then implanted in the donor substrate 1, for example within the secondary layer 12, to form a zone of weakness 13 therein. The zone 13 defines an upper active layer 14 from the remainder 15 of the substrate. In accordance with the invention, atomic species are implanted within the insulating layer 3 to form a trapping layer 31 therein.

Figure 1D:
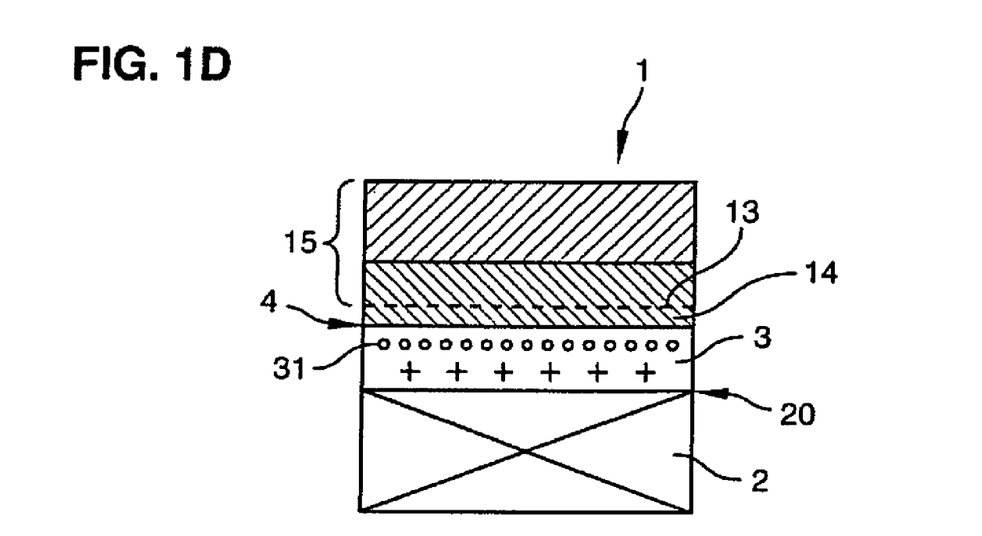
Figure 1E:
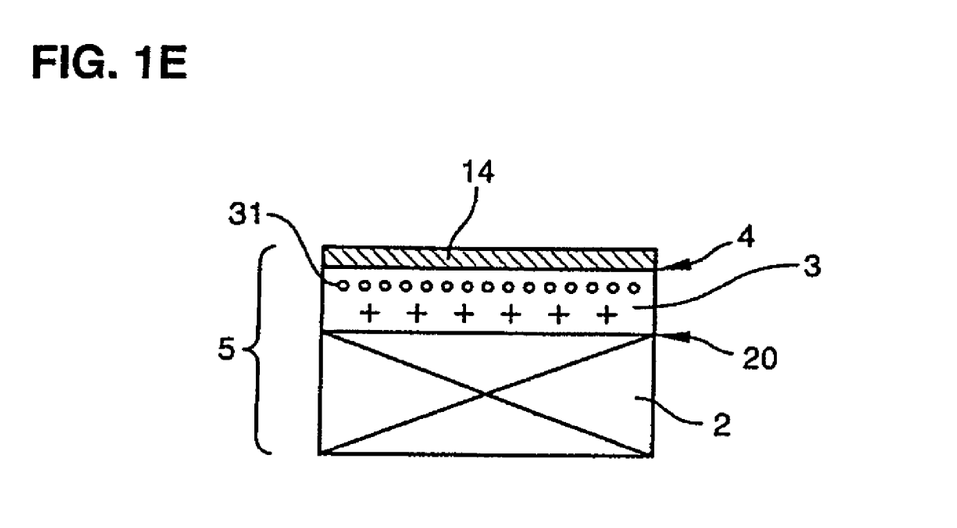

As FIG. 1D shows, bonding of the two substrates, donor 1 and receiver 2, is then carried out by molecular bonding, by bringing the active layer 14 into intimate contact with the insulating layer 3. The bonding interface carries reference number 4. The back portion 15 is then withdrawn as shown in FIG. 1E.

In a particular case in which a zone of weakness 13 exists, the withdrawal corresponds to detaching the back portion or remainder 15 of the substrate. Detachment is achieved by applying mechanical, chemical or electrical stresses to the zone of weakness 13, and a heterostructure 5 is obtained.

FIGS. 2A to 2F illustrate another embodiment of the invention. This embodiment differs from the preceding method in that an insulating layer 6 is deposited or formed on the source substrate 1 prior to implantation of atomic species to form the zone of weakness 13.

Figure 2A:
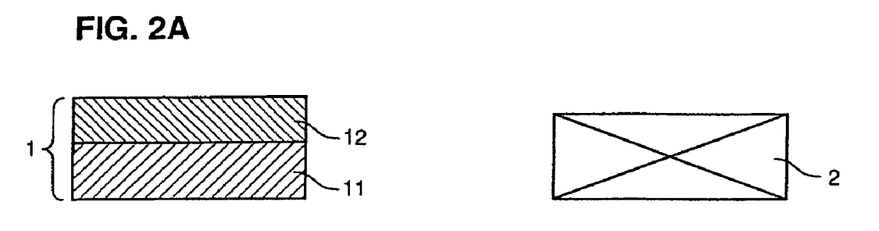
FIGS. 2A to 2F graphically illustrate various successive steps according to another embodiment of the present fabrication method.
Figure 2B:
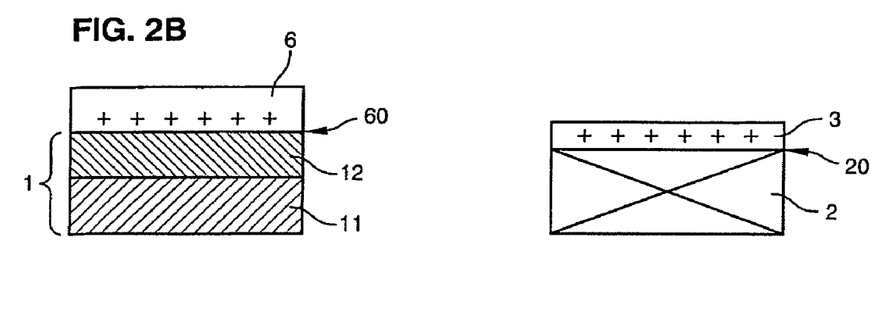
Figure 2C:
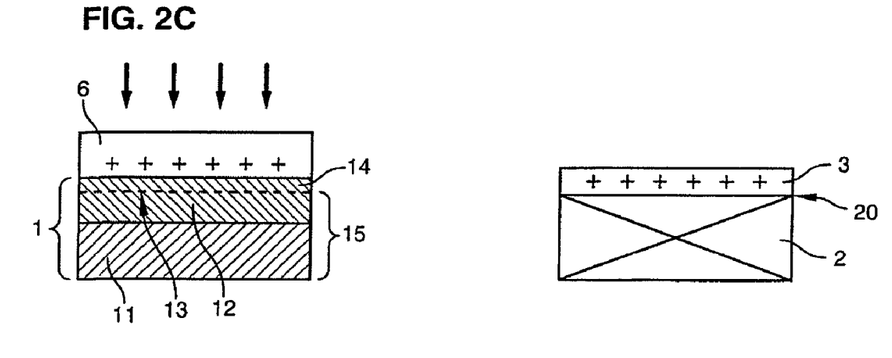
Figure 2D:
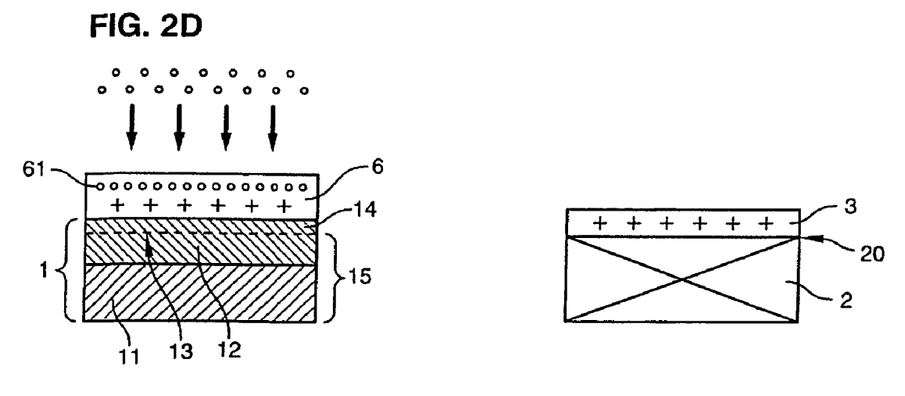

A connection interface 60 exists between the insulating layer 6 and the source substrate 1 and, as can be seen in FIG. 2D, atomic species implantation is carried out within the insulating layer 6 to form a trapping layer 61 therein. In the implementation shown in FIG. 2D, the insulating layer 3 does not undergo the same treatment. In addition, it would also be possible to form a trapping layer 31 therein, thus obtaining a final composite substrate comprising two trapping layers.

Figure 2E:
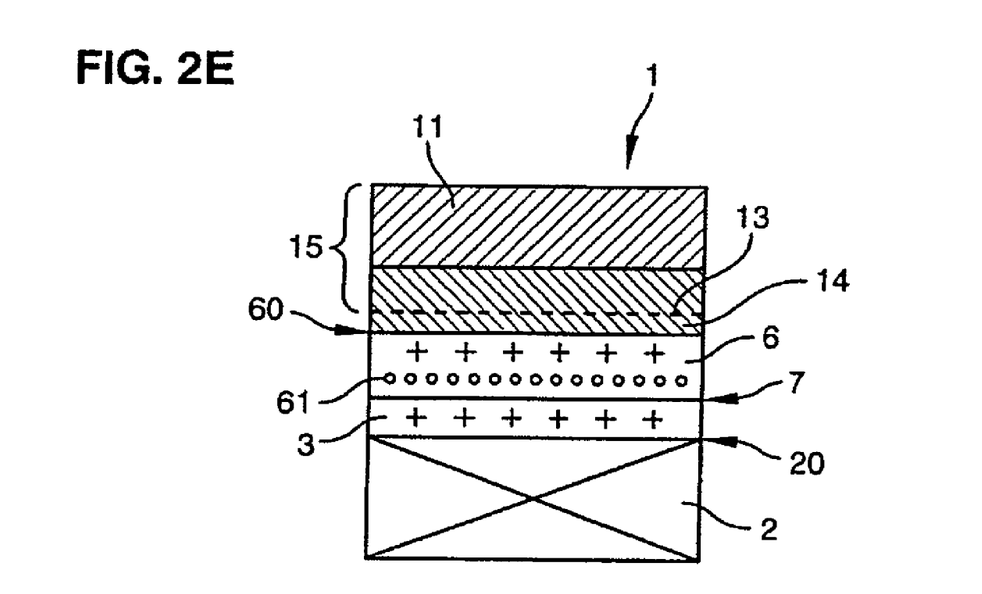
Figure 2F:
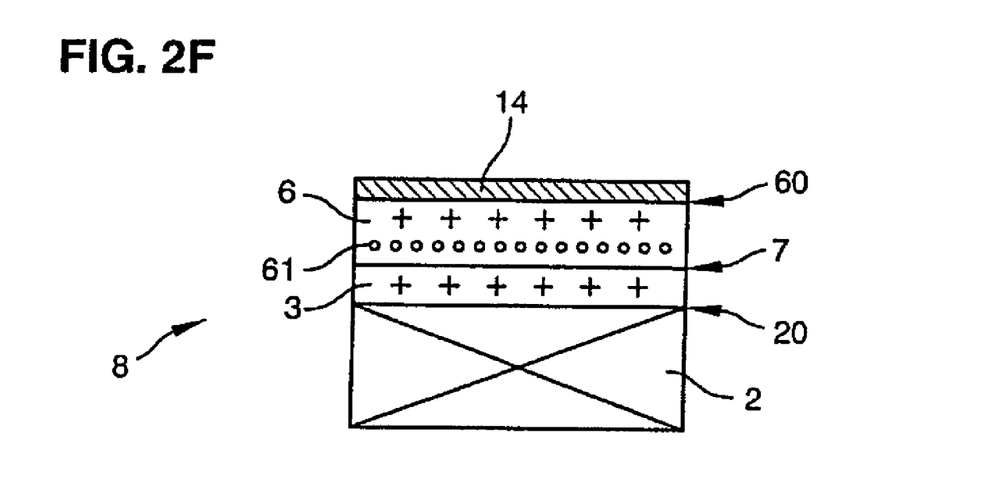

Finally, as can be seen in FIG. 2E, the two substrates 1 and 2 are bonded by molecular bonding so that a bonding interface 7 is formed between them. After detaching the remainder 15 from the source substrate 1, the heterostructure 8 shown in FIG. 2F is obtained. The heterostructure 8 comprises two insulating layers 3, 6, interposed between two layers of semiconductor materials, 14, 2.

In the two embodiments described above, the remainder 15 is detached from the source substrate 1 after forming a zone of weakness by atomic species implantation. However, the implantation step could also be dispensed with, the remainder 15 then being withdrawn by a chemical-mechanical polishing step, known as CMP in the art.

The nature and characteristics of the materials constituting the source and receiver substrates and the insulating layer are described below in more detail.

The donor 1 and the receiver 2 substrates are constituted at least in part by semiconductor materials, in particular those in routine use in the electronics field. For example, they may be silicon (Si), germanium (Ge), gallium nitride (GaN), gallium arsenide (AsGa), or silicon germanium (SiGe).

The insulating layers 3, 6 are preferably selected from oxides such as silicon oxide ($SiO_2$). A nitride may also be used, for example silicon nitride ($Si_3N_4$) or an oxynitride, for example germanium oxynitride ($Ge_xO_yN_z$). It is also possible to use high permittivity dielectric materials ("high k" materials) such as hafnium dioxide ($HfO_2$), alumina ($Al_2O_3$), zirconium oxide ($ZrO_2$), tantalum pentoxide ($Ta_2O_5$), titanium dioxide ($TiO_2$), their nitrides and their suicides. When the insulating layers 3 or 6 are made with an oxide, they may be obtained by thermal oxidation of the source substrate 1 or the support 2 on which they have to be formed.

The insulating layers 3 or 6 may also be obtained by deposition, for example chemical vapor deposition. By way of example, for silicon dioxide ($SiO_2$), it is possible to use low pressure chemical vapor deposition (LPCVD) or atomic layer deposition (ALD). In the case of depositing a $SiO_2$ layer, it is also possible to carry out LPCVD deposition from a tetraethylorthosilicate (TEOS) type precursor.

Atomic species implantation to form a zone of weakness within the source substrate may, for example, be carried out using the commercially known SMART-CUT® method. For more details regarding that method, reference could be made to the document J. P. Collinge, *Silicon on Insulator Technology*, Materials to VLSI, pp. 50-51 (2d ed. Kluwer Academic Publishers).

The term "atomic species implantation" generally designates any type of treatment which can introduce atomic or ionic species into the implanted donor substrate, with a maximum concentration of species located at a predetermined depth from the treated surface. Atomic species implantation in the insulating layer 3, 6 to form therein a trapping layer 31 or 61, respectively, is further described below.

The trapping layer is intended to trap diffusing gaseous species. Forming the trapping layer consists of implanting at least one category of atomic species within the insulating layer, the atomic species being selected so that it is either identical or isoelectric with one of those constituting the insulator. Thus, it is possible to implant a single kind of atomic species, or several in succession. This step can either oversaturate the insulator with at least one kind of atoms contained therein, or introduce thereto an "isoelectric" atomic species. The term "isoelectric atom" designates any atom belonging to the same column of the periodic table as one of the atoms constituting the insulator. The choice of atom depends on its chemical reactivity towards the types of atoms constituting the insulator.

Purely by way of example, for a layer of silicon oxide ($SiO_2$), it is possible to implant oxygen, silicon, and/or germanium, which are isoelectric elements of silicon oxide. It is possible to implant nitrogen, silicon, and/or germanium into a layer of silicon nitride ($Si_3N_4$).

The trapping layer obtained may be constituted with two types of traps depending on the nature of the implanted element, namely: voids (nanocavities) when implanting atoms such as oxygen or nitrogen; and nanoparticles, when implanting silicon or germanium.

The implantation parameters which may be adjusted are the implantation energy, which allows the depth at which the trapping layer is formed to be varied, and the implantation dose, which allows the size of the agglomerates of atoms and the density of the nanoparticles or voids (nanocavities) to be modified.

As an example, by implanting silicon in $SiO_2$, with an implantation energy in the range 0.65 keV to 3 keV and an implantation dose in the range $5 \times 10^{15}$ to $2 \times 10^{16}$ $Si^+/cm^2$, a trapping layer is obtained located at a depth in the range $-4$ nm to $-6$ nm beneath the free surface of the $SiO_2$, the trapping layer being in the range 2 nm to 3 nm thick and having a very high nanoparticle surface density of more than $1 \times 10^{15}$ $cm^{-2}$.

Advantageously, the trapping layer may be formed at any depth in the insulating layer.

In one example, it is formed close to the bonding interface, which is the source of gas accumulation, and functions as a chemical pump.

The trapping layer may also be formed close to the connection interface between the insulating layer and the substrate. This is particularly advantageous in the case of a deposited oxide where the connection interface may be a large zone for accumulation of gaseous atomic species. The trapping zone then helps reduce the concentration of gas accumulated at the connection interface.

When there are two insulating layers 3 and 6, as shown in FIG. 2, it may also be advantageous to form a trapping layer in each of the two insulating layers. Preferably, these trapping layers are then formed at various depths so that one is close to a connection interface and the other is close to the bonding interface.

Once the heterostructure has been formed, thermal annealing can be performed. Thermal annealing is intended to strengthen the bonding and to change the trapping layer. The annealing method is limited by the maximum applicable thermal balance, as further explained below.

A plurality of physico-chemical phenomena cause traps to form, which then capture gaseous species.

When the traps are nanoparticles, they are formed in the insulator during implantation, and some of them partially coalesce to form small agglomerates of particles. The coalescence results in formation of a two-dimensional layer of nanoparticles and small agglomerates, which trap gaseous species, in particular hydrogen, by a mechanical and by a chemical effect. The term "coalescence" in this case designates the distribution and reorganization of nanoparticles in the same plane as implantation.

The trapping layer is two-dimensional because it extends over the whole surface of the structure, at a depth controlled by the implantation energy. It traps diffusing species and prevents them from reaching the neighboring bonding or connection interfaces.

The chemical trapping effect corresponds to formation of bonds between the elements present. Thus, for example, atoms of silicon or germanium introduced into a layer of $SiO_2$ form Si—H or Ge—H bonds when hydrogen is released close by. The chemical hydrogen trapping reaction is particularly favored in the case of germanium implantation as the formation energy for the Ge—H bond is much lower.

The mechanical trapping effect corresponds to establishing a concentration gradient between the bonding or connection interface and the trapping zone. Coalescence of nanoparticles allows the trap density to be increased. The concentration of atoms imprisoned in these traps increases. Thus, a gradient of atoms of free gas is set up between the bonding or connection interface and the trapping layer. Diffusion of gaseous species toward the traps is thus increased until the traps become saturated.

Finally, it should be noted that even when annealing is carried out after the trapping layer is formed (see FIGS. 1C and 2D), the agglomerates of particles obtained remain small. In fact, the anneal must be carried out at a temperature below that of the subsequent detachment step, after bonding (see FIGS. 1E and 2F respectively).

There are therefore a multitude of small agglomerates of a few angstroms which start to coalesce in the form of nanoparticles. Trapping is principally ensured by the small agglomerates, produced at a low thermal balance.

When the traps are voids (nanocavities), free gas particles become trapped therein, and the species accumulate in the voids buried in the insulator. A concentration gradient is set up between the free gas species and the gas species "frozen" in the defects created in the oxide. the concentration gradient is the driving force for trapping until the voids (nanocavities) are saturated.

EXAMPLES

Several examples of the present method are described below in further detail.

Example 1

A donor substrate was prepared by growing a layer of germanium on silicon by epitaxy. Hydrogen and/or helium was then implanted in the germanium to create a zone of weakness. A silicon receiver substrate was also prepared by depositing therein an insulating layer of silicon oxide ($SiO_2$) 250 nm to 300 nm thick.

Silicon was then implanted in the $SiO_2$ layer to create therein a two-dimensional trapping layer. The implantation was carried out at an energy of 0.5 to 5 keV, at a dose of $5 \times 10^{15}$ to $5 \times 10^{16}$ $Si^+$ ions/cm². This resulted in formation of a layer of nanoparticles located between 1.5 nm and 4 nm (nanometers) beneath the surface of the $SiO_2$ layer with a thickness in the range 2 nm to 3 nm.

Bonding and detachment were carried out as described above with reference to FIGS. 1 and 2.

Example 2

Figure 4:
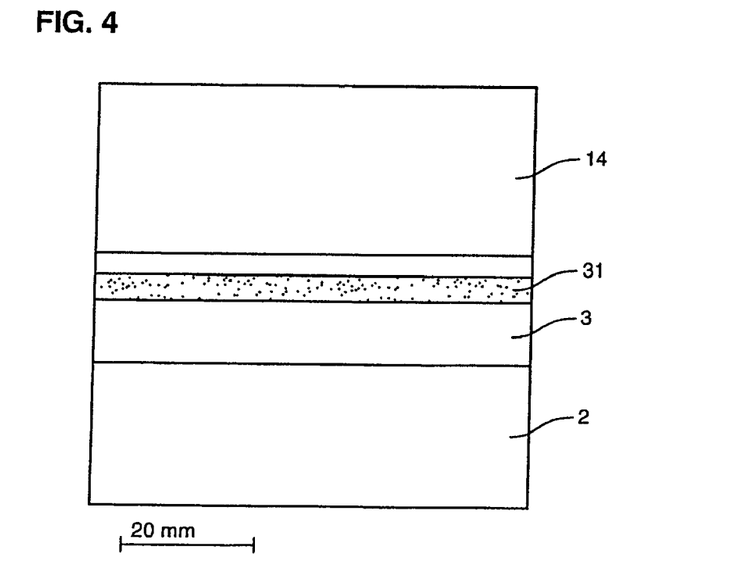
FIG. 4 graphically illustrates a section through part of an oxidized support substrate prior to SeOI bonding, including a trapping layer formed in the $SiO_2$ layer.

FIG. 4 is a drawing produced from a photograph obtained by transmission electron microscopy (TEM), and shows a trapping layer formed in a layer of SiO$_2$ by implanting silicon at an energy of 1 keV and a dose of 1×10$^{16}$ Si$^+$/cm$^2$. The trapping layer 31 appears as a black line in the middle of the oxide 3.

In addition, tests were carried out to determine the range of energy and implantation dose to be used in producing the trapping layer when the insulator was made with silicon dioxide (SiO$_2$) or silicon nitride (Si$_3$N$_4$).

When the insulator was silicon dioxide (SiO$_2$), the implanted species preferably include silicon, germanium, or oxygen. In this case, either only one of the categories of atomic species mentioned below or several of them in succession may be implanted:

Silicon atoms with an implantation energy in the range 0.5 keV to 5 keV and an implantation dose in the range of 5×10$^{15}$ to 5×10$^{16}$ Si$^+$/cm$^2$. Under these conditions, the layer of nanoparticles is located 15 nm to 40 nm beneath the bonding interface. Increasing the implantation dose allows to increase the surface density of the traps and thus modulate the total quantity of atoms of gas imprisoned on the traps. A skilled artisan can determine the precise dose to obtain the desired reduction or limit of defects in or on the active layer.

Germanium atoms with an implantation energy in the range of 0.7 keV to 10 keV and an implantation dose in the range 5×10$^{15}$ to 1×10$^{17}$ Ge$^+$/cm$^2$. Since germanium is heavier, the implantation energy range is broader to position the plane of nanoparticles in the same depth range as would be obtained with silicon atom implantation.

Oxygen atoms with an implantation energy in the range of 0.5 keV to 3 keV and an implantation dose in the range 1×10$^{15}$ to 1×10$^{17}$ O$^+$/cm$^2$. Since oxygen is lighter, the implantation energy window is reduced in this case with respect to silicon implantation, to position the trapping zone at the same preferred depth.

When the insulator is silicon nitride (Si$_3$N$_4$), the implanted species are preferably silicon, germanium or nitrogen atoms. Again, only one of the atomic species categories mentioned below or several thereof in succession may be implanted, as desired:

Silicon atoms with an implantation energy in the range 0.5 keV to 5 keV and an implantation dose in the range 5×10$^{15}$ to 5×10$^{16}$ Si$^+$/cm$^2$;

Germanium atoms with an implantation energy in the range 0.7 keV to 10 keV and an implantation dose in the range 5×10$^{15}$ to 1×10$^{17}$ Ge$^+$/cm$^2$;

Nitrogen atoms with an implantation energy in the range 0.5 keV to 3 keV and an implantation dose in the range 1×10$^{15}$ to 1×10$^{17}$ N$^+$/cm$^2$.

The SeOI fabrication method of the invention can also eliminate the defects caused by the accumulation of gas at the bonding or connection interfaces of a heterostructure.

The present method is applicable to fabrication of semiconductor on insulator substrates with any type of semiconductor material since the trapping layer is formed in the oxide. The advantages of the present method are more pronounced in the case of GeOI, since SIMS profiles show that a large quantity of hydrogen is present in the oxide.

What is claimed is:

1. A method for providing a semiconductor heterostructure which comprises:
   providing donor and receiver substrates;
   providing at least one insulating layer on at least one of the donor or receiver substrates;
   implanting atomic species in the insulating layer(s) to form a trapping layer within the insulating layer, with the atomic species being identical to or isoelectric with one of the species constituting the insulating layer so that the trapping layer is capable of sufficiently retaining gas in the interface to reduce or limit formation of defects in or on the active layer;
   bonding the donor substrate and the receiver substrate by molecular bonding of their respective top surfaces to interpose the insulating layer(s) between the donor and receiver substrates and form a connection interface between such surfaces; and
   removing a portion of the donor substrate to provide the heterostructure and expose an active layer, wherein the heterostructure comprises the receiver substrate, the insulating layer(s) and the active layer;
   forming a zone of weakness in the donor substrate prior to bonding, with the zone of weakness defining the active layer from the portion of the donor substrate to be removed, wherein the zone of weakness is formed by the implantation of atomic species that are different from those used to form the trapping layer.

2. The method according to claim 1, which further comprises annealing the insulating and trapping layers at a temperature of at least about 350° C. for at least 30 minutes.

3. The method according to claim 1, wherein the trapping layer is formed proximate to the bonding interface.

4. The method according to claim 3, wherein the trapping layer is formed at a distance of about 2 nanometers to 10 nanometers from the bonding interface.

5. The method according to claim 1, wherein the trapping layer is formed proximate to the connection interface.

6. The method according to claim 1, wherein the insulating layer comprises an oxide or nitride material.

7. The method according to claim 6, wherein the insulating layer comprises silicon dioxide (SiO$_2$) and the implanted atomic species comprises silicon, germanium or oxygen atoms.

8. The method according to claim 7, wherein silicon atoms are implanted with an implantation energy in the range of about 0.5 keV to 5 keV and an implantation dose in the range of about 5×10$^{15}$ to 5×10$^{16}$ Si$^+$/cm$^2$.

9. The method according to claim 7, wherein germanium atoms are implanted with an implantation energy in the range of about 0.7 keV to 10 keV and an implantation dose in the range of about 5×10$^{15}$ to 1×10$^{17}$ Ge$^+$/cm$^2$.

10. The method according to claim 7, wherein oxygen atoms are implanted with an implantation energy in the range of 0.5 keV to 3 keV and an implantation dose in the range of about 1×10$^{15}$ to 1×10$^{17}$ O$^+$/cm$^2$.

11. The method according to claim 6, wherein the insulating layer comprises silicon nitride (Si$_3$N$_4$) and the implanted atomic species comprises silicon, germanium or nitrogen atoms.

12. The method according to claim 11, wherein silicon atoms are implanted with an implantation energy in the range of about 0.5 keV to 5 keV and an implantation dose in the range of about 5×10$^{15}$ to 5×10$^{16}$ Si$^+$/cm$^2$.

13. The method according to claim 11, wherein germanium atoms are implanted with an implantation energy in the range of about 0.7 keV to 10 keV and an implantation dose in the range of about 5×10$^{15}$ to 1×10$^{17}$ Ge$^+$/cm$^2$.

14. The method according to claim 11, wherein nitrogen atoms are implanted with an implantation energy in the range of about 0.5 keV to 3 keV and an implantation dose in the range of about 1×10$^{15}$ to 1×10$^{17}$ N$^+$/cm$^2$.

15. The method according to claim 1, wherein the portion of the donor substrate is removed by chemical-mechanical polishing.

16. The method according to claim 1, wherein the zone of weakness is formed by the implantation of hydrogen or helium ions.

17. The method according to claim 1, which further comprises transferring the active layer to the receiver substrate by detaching it at the zone of weakness after the substrates are bonded together.

18. The method according to claim 17, wherein the detaching is achieved by applying mechanical, electrical or chemical stresses to the zone of weakness.

* * * * *